United States Patent [19]

Restall et al.

[11] Patent Number: 4,946,749
[45] Date of Patent: Aug. 7, 1990

[54] COATED NEAR -α TITANIUM ARTICLES

[75] Inventors: Janet E. Restall, Camberley; Tony Homewood, Farnborough, both of England

[73] Assignee: The Secretary of State for Defence in Her Britannic Majesty's Government, London, England

[21] Appl. No.: 435,398

[22] PCT Filed: May 17, 1988

[86] PCT No.: PCT/GB88/00389

§ 371 Date: Oct. 31, 1989

§ 102(e) Date: Oct. 31, 1989

[87] PCT Pub. No.: WO88/09396

PCT Pub. Date: Dec. 1, 1988

[30] Foreign Application Priority Data

May 18, 1987 [GB] United Kingdom ............... 8711697

[51] Int. Cl.$^5$ ............................................ B32B 15/00
[52] U.S. Cl. ................................... 428/660; 428/681
[58] Field of Search ............. 428/660, 661, 666, 667, 428/681, 685; 148/421

[56] References Cited

U.S. PATENT DOCUMENTS

| | | | |
|---|---|---|---|
| 2,813,332 | 11/1957 | Keay | 428/660 |
| 2,908,966 | 10/1959 | Wagner | 428/660 |
| 3,268,306 | 8/1966 | Jeffreys | 428/661 |
| 3,471,342 | 10/1969 | Wood | 428/661 |
| 3,560,274 | 2/1971 | Ogden | 428/661 |
| 3,691,029 | 9/1972 | Raymond et al. | 428/660 |
| 3,713,901 | 1/1973 | Blumenthal et al. | 428/661 |
| 3,756,193 | 9/1973 | Carmichael et al. | 118/49.1 |
| 4,034,142 | 7/1977 | Hecht | 428/678 |
| 4,137,370 | 1/1979 | Fujishiro et al. | 428/660 |
| 4,273,824 | 6/1981 | McComas et al. | 428/661 |
| 4,305,998 | 12/1981 | Manty et al. | 428/660 |

FOREIGN PATENT DOCUMENTS

| | | | |
|---|---|---|---|
| 168931 | 1/1986 | European Pat. Off. | |
| 2390279 | 12/1978 | France | |
| 56-72167 | 6/1981 | Japan | 428/660 |
| 58-77586 | 5/1983 | Japan | 428/660 |
| 749365 | 5/1956 | United Kingdom | |

OTHER PUBLICATIONS

R. Warg et al., "Amorphous Iron Alloys Containing Chromium", Chemical Abstracts, vol. 96, 1982, No. 96: 23259n.

Thin Solid Films, vol. 63, No. 1, Oct. 1979, Elsevier Sequoia S.A. Lausanne (CH), F. Fujishiro et al.: "Creep Property Improvement of $\alpha+\beta$ Titanium Alloys by Platinum Ion Plating", pp. 55–60.

Thin Solid Films, vol. 45, 1977, Elsevier Sequoia S.A. Lausanne (CH), D. G. Teer et al.: "The Formation of Low Friction Wear-Resistant Surfaces on Titanium by Ion Plating", pp. 583–589.

Primary Examiner—John J. Zimmerman
Attorney, Agent, or Firm—Nixon & Vanderhye

[57] ABSTRACT

Articles of titanium based materials are protected against alpha case formation such as results from exposure to air at high temperatures by coating with an iron-chromium based alloy. The coating may be deposited by ion plating, sputter plating or sputter ion plating these methods being preferred for avoidance of surface contamination. A preferred iron to chromium ratio (by weight) is 10:1 to 2.5:1. Specific coating compositions (given by weight) are: (a) 12Cr-1(Mo+Zr)-0.15C-balance Fe, b) 15.5Cr-4.8Al-0.3Si-0.03C-balance Fe.

7 Claims, 6 Drawing Sheets

S124 STEEL COATING

S124 STEEL COATING

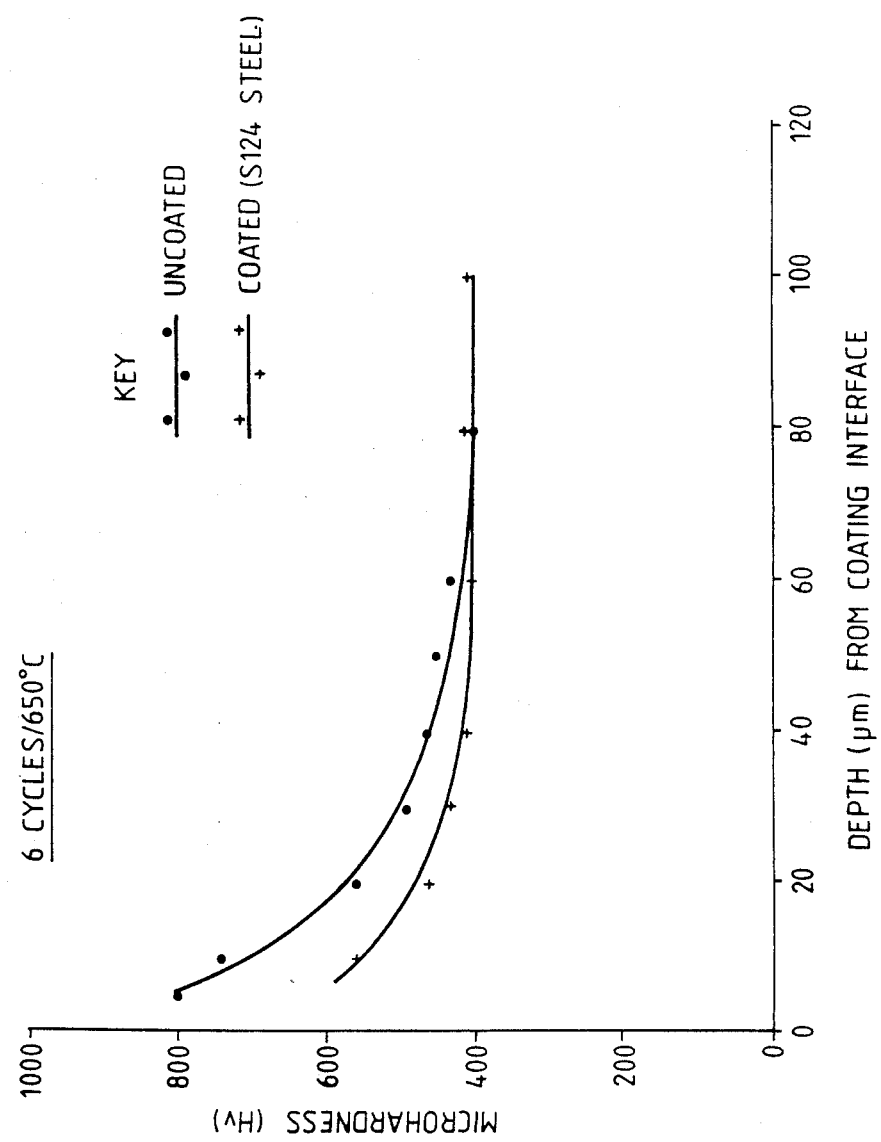

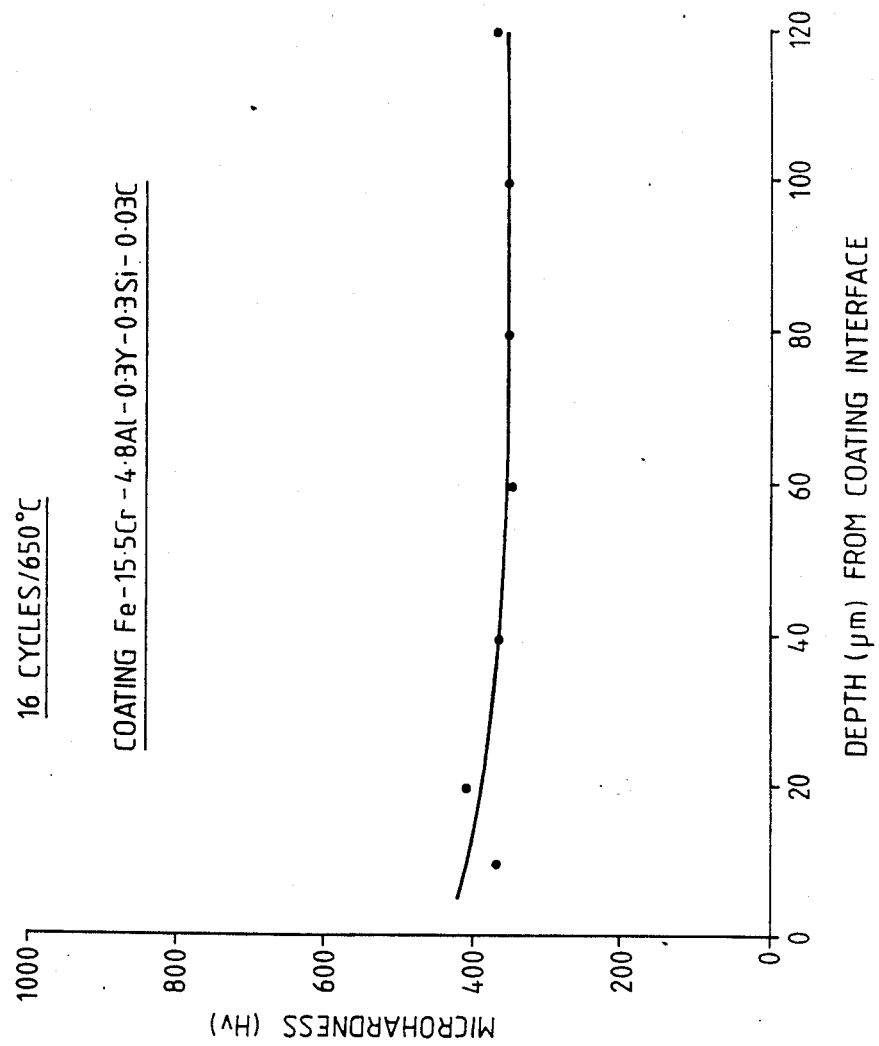

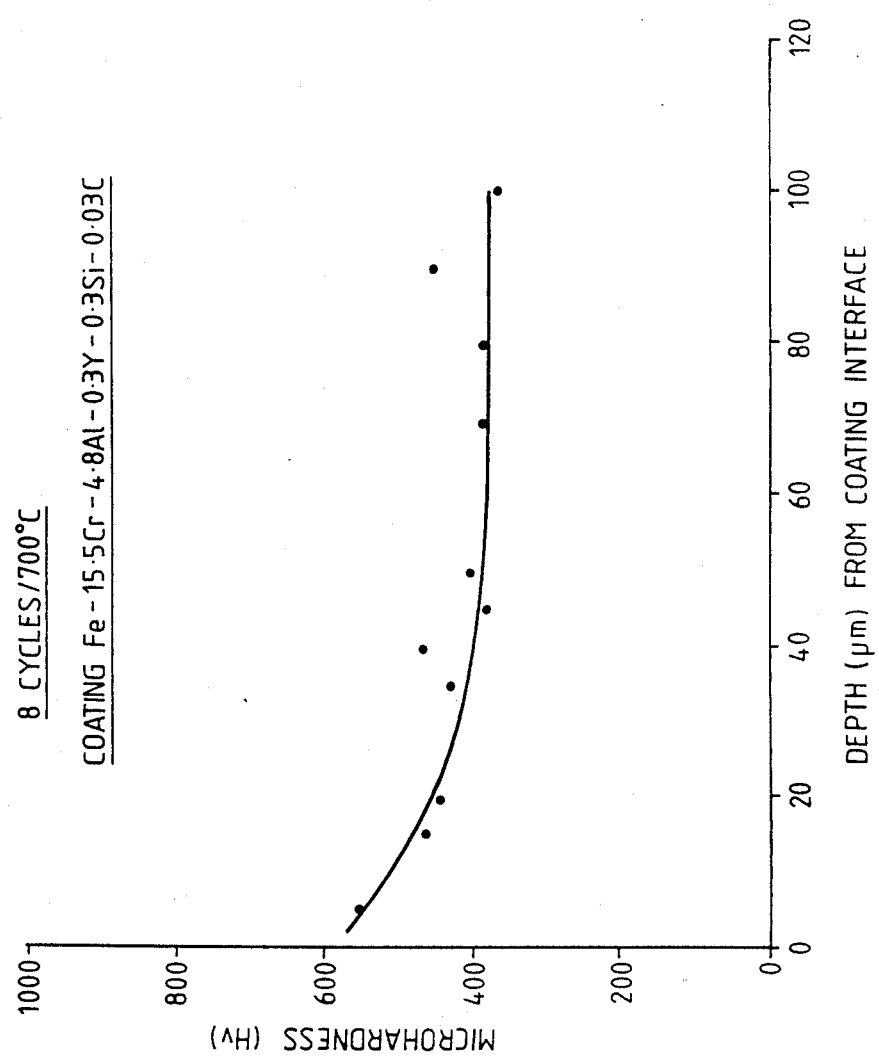

COATED NEAR -α TITANIUM ARTICLES

This invention relates to protective coatings for articles of near -α titanium based alloys. It is particularly concerned with coatings for gas turbine engine compressor stage components formed in near -α titanium based alloys suitable to convey at least high temperature oxidation resistance and preferably also high temperature corrosion resistance to these components.

Pure titanium undergoes an allotropic transformation at 882° C. from the lower temperature phase, designated the α phase, which has a hexagonal close-packed (hcp) structure to a higher temperature phase, designated the β phase, which is stable up to the melting temperature and had a body centre cubic structure. Titanium alloys are conventionally categorised as α-type alloys, β-type alloys or α+β alloys by virtue of the nature and level of the alloying additions they contain. Near -α titanium alloys are titanium based with additions of, amongst other things, α-stabilising elements such as aluminium and tin that promote the hexagonal close packed structure of the α-phase. The α-phase has very good high temperature creep properties and in near -α titanium alloys these good creep properties are achieved while still maintaining adequate low temperature strength and forgeability.

This excellent balance of strength, ductility, microstructural stability and oxidation/corrosion resistance as compared with competitive materials such as steels or nickel based superalloys has resulted in near -α titanium alloys becoming increasingly important as constructional material for compressor components in advanced gas turbine engines.

A wide variety of these high strength near -α titanium alloys have been developed commercially to tolerate operating conditions involving prolonged exposure to air at temperatures up to 500° C. The following commercial alloys of IMI Titanium Ltd (identified by their commercial designation and nominal composition in weight percent) are typical of the current generation of titanium alloys suitable for gas turbine compressor applications. These are: IMI 550 (Ti-4Al-2Sn-4 Mo-0.5Si); IMI 679 (Ti-11Sn-2.25Al-5Zr-1Mo-0.25Si); IMI 685 (Ti-6Al-5Zr-0.5Mo-0.25Si) IMI 829 (Ti-5.5Al-3.5Sn-3Zr-0.25o-0.3Si) and IMI 834 (Ti-5.8Al-40Sn-3.5Zr-0.7Nb-0.5Mo-0-35Si-0.06C-0.090).

There is continuing commercial interest in increasing the temperature tolerance of near -α titanium alloys in order that gas turbine engine cycle temperatures can be raised to increase engine efficiency without recourse to other materials. There is also the possibility that an increase in temperature tolerance might permit these titanium alloys to be used for components currently made of say nickel-based superalloys with consequent reduction in component weight. Some of the conventional near -α titanium alloys exhibit excellent creep resistance and good structural stability at temperatures significantly above the 500° C. mentioned earlier - say to 650° C. However, when such alloys are exposed to air at temperatures approaching 600° C. they are subject to significant and detrimental surface modification. The principal factor involved in this surface modification is the uptake of oxygen into solid solution by the titanium. At these temperatures the reaction kinetics ensure rapid diffusion of oxygen into the region adjacent the exposed surface. Approximately 30 atomic percent may be dissolved in the titanium. The dissolved oxygen creates in the affected region a hard brittle zone. The affected zone is called the alpha case and its formation can substantially degrade the structural integrity of the affected article by loss of tensile ductility and of fatigue resistance even though the interior of the article is not subject to structural modification. Nitrogen plays some part in the degradation process which occurs but the predominant factors in alpha case formation are the presence of oxygen, the exposure time and the temperature. The terms "oxidation", "oxidation resistance" and related terms are hereinafter intended to encompass both oxygen and nitrogen effects; the terms being used to distinguish these effects from other forms of attack both chemical - such as aqueous corrosion and high temperature sulphidation or alkali metal salt corrosion and non-chemical attack by erosion. Corrosion can be a life limiting factor under some circumstances for example gas turbine components for aircraft that fly at low altitudes across the sea in high salt environments. It is desirable therefore, that a coating can also convey some degree of protection against corrosion attach.

The phenomenon of high temperature oxidation in titanium and titanium based alloys is not new-found and attempts have already been made to overcome this. One approach to this is to vary the alloy composition in such a way as to convey adequate intrinsic resistance. However, all alloy compositions represent an optimisation of conflicting requirements and it is quite likely that such titanium alloy compositions as could be produced to solve the oxidation problem would be deficient in other respects. The aforementioned present generation titanium alloys especially IMI 829, IMI 834 and other near -α titanium alloys are well established in the art and would be suitable for higher temperature applications if adequately protected against high temperature oxidation.

Although protective coatings are well established and widely used for the corrosion/oxidation protection of the nickel-based superalloys used in the hot sections of the turbine stage, oxidation protective coatings are not yet well established for titanium compressor components.

There are special difficulties involved in providing a coating that is resistant to high temperature degradation, impervious to oxygen, adheres securely to the near -α titanium substrate and can be deposited by a process that does not impair the properties of the substrate.

Plasma spraying conventionally used in coating a wide variety of materials such as nickel based superalloys, deposits coatings that are characteristically porous and internally stressed and consequently require substantial post deposition treatment to form an oxidation resistant coating. The heat treatments necessarily involved will often be at temperatures that reverse properties carefully secured in the near -α titanium alloys through prior heat treatment at temperatures typically in the region of 1000°-1100° C. We believe plasma spraying will be inappropriate for coating near -α titanium alloy substrates for this reason.

It is known that surface enrichment of α/β titanium alloys with platinum improves the oxidation resistance (as measured by fatigue properties) at temperatures up to 450° C but the published work on this does not suggest any improvement in oxidation resistance at higher temperatures nor is such an improvement suggested by the Applicant's experiments with platinum enrichment. The Applicant has found also that only marginal improvement in high temperature oxidation resistance is secured by coating with gold, or nickel, or chromium or platinum overlaid with nickel, these being deposited by a sputter ion plating method.

Aluminide coatings and chromised coatings are well known in the protection of nickel based superalloys. These are produced either by deposition of pure metal by cementation or chemical vapour deposition followed by heat treatment to form the intermetallic compound, or alternatively by physical vapour deposition of the intermetallic. Such coatings are not suitable for conveying high temperature oxidation resistance to titanium or titanium alloy as they form brittle intermetallic phases at the interface with the parent material which renders the coating susceptible to spallation damage, particularly when subject to thermal cycling. Moreover the deposition temperature of 750° C. or more required for cementation or chemical vapour deposition processes would unacceptably degrade the properties of a near -α titanium alloy component.

Chemical routes generally such as chemical vapour deposition tend not to be suitable for coating near -α titanium alloys, as surface cleanliness and contamination are very important. Both halide and carbonyl atmospheres used in such processes, along with the temperatures needed for deposition make it difficult to clean the surface to prevent contaminants being introduced that can impair adhesion. Contamination at the coating stage can also lead to the formation of an embrittled layer within the substrate below the coating which is detrimental to the substrate in itself and is detrimental also to the durability of the coating. Halide contamination can lead to the formation of such embrittled layers as well as oxygen contamination which is a particular problem because of the high solubility of oxygen in titanium.

SUMMARY OF THE INVENTION

The aim of this invention is to provide an oxidation resistant coating for the protection of near -α titanium alloys to increase the temperature to which such alloys suitably coated can be operational in gas turbine engine compressor applications. To achieve this aim a coating must protect the substrate against the loss of fatigue resistance, toughness and ductility due to oxidation that will prevent near -α titanium alloys being used for components with an operational temperature much in excess of 600° C. As recently developed near -α titanium alloys exhibit the creep resistance and structural stability necessary to withstand repeated excursions to well above 600° C. Suitable coatings to protect components such as gas turbine engine compressor components from oxidation and /or corrosion would enable the high temperature mechanical properties of near -α titanium alloys to be utilised by increasing operational temperatures to well above 600° C.

The invention is an article comprising a near -α titanium based alloy when coated with a high temperature oxidation and/or corrosion resistant coating, the coating being applied by a process selected from the group consisting of ion plating, sputter plating and sputter ion plating and comprising an iron-chromium based alloy wherein the iron and chromium in combination constitute at least 75% by weight of the applied coating with an iron to chromium ratio in the range 10:1 to 2.5:1 by weight.

The article may be wholly metal or a reinforced metal such as a metal matrix composite. The coatings of this invention possess good intrinsic resistance to high temperature oxidation and low permeability to oxygen and nitrogen whilst possessing other attributes which are desirable such as resistance to spallation when thermally cycled, and interface ductility consequent upon the formation of ductile titanium-nickel intermetallic phases. There is some mismatch between the coefficient of expansion of the coating and titanium based substrates but this is not so great as to present a problem.

The coating may contain other elements in addition to the iron-chromium base, but preferably retains a iron to chromium ratio within the aforementioned range. To promote a film of stable aluminium oxide at the exposed surface of the coating aluminium may be included, preferably 2-12 percent by weight. Silicon may also be included to provide a harder, more erosion resistant surface. A preferable range for the silicon addition is 2-12 percent by weight. Yttrium may be included also, but is principally of benefit in aluminium containing compositions, for promotion of oxide scale adherence at higher temperatures. Up to one weight percent of yttrium may be included. The coating may include other elements capable of contributing to the effectiveness of the system, in minor proportion say up to one weight percent. Elements in this class are boron, precious metals (platinum rhodium and silver), rare earths (lanthanum and cerium) and some reactive elements (hafnium titanium and zirconium). The coating may include low levels of the impurities found in commercial candidate materials—such as carbon—and may include other elements present in candidate materials which do not contribute significantly to the coating but cause no impairment.

The ion plating, sputter plating and sputter ion plating are all sub-atmospheric pressure process which can be performed under argon cover so they minimise the possibilities for contamination during coating. Moreover with each of these it is possible to pre clean the substrate by ion bombardment then move directly to the deposition stage. These plating processes are well established in the art so no general description of them is offered here.

Specific examples of coated titanium based components according to the invention are described below. Reference is made to uncoated titanium based components for the purpose of comparison. The comparison of coated and uncoated specimens is made with reference to the accompanying drawings.

BRIEF DESCRIPTION OF THE DRAWINGS

FIGS. 4-7 are graphs depicting microstructural modification consequent upon oxidation testing, as measured by microhardness measurements on a traverse across the surface regions.

DESCRIPTION OF THE PREFERRED EMBODIMENTS

EXAMPLE 1

Cylindrical test pins to IMI829 alloy were coated to a depth of approximately 5 μm by means of a hot rod target sputtering process using targets of British Standard S124 stainless steel. S124 steel has the nominal composition by weight of: 12Cr-1(Mo +Zr)-0.15C-balance Fe. The sputtering process was of the type described by R G Duckworth in Proc Int Conf on Thin and Thick Film Technology, Ausberg, 1977, NTG60, VDE, Berlin 1977 pp 83–87. There are no significant differences between the sputtering coefficients of the elements in the S124 target so the coating deposited by the sputtering process should have the same composition as the target. This composition was confirmed by microprobe analysis of the coatings.

Figure 1:
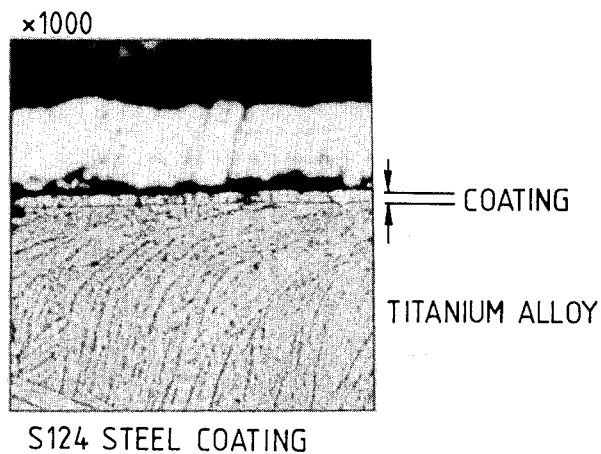
FIG. 1 is a microsection of a coated specimen in the as-coated condition.

FIG. 1 shows a microsection at ×1000 magnification of an IMI829 test pin which has been coated as described above. It will be seen that the coating is dense and adherent. A traverse of microhardness measurements across a section as shown reveals no significant variation in hardness as would be indicative of surface contamination in the coating process.

The S124 coated test pins were subjected to cyclic oxidation testing by exposure to air in an open furnace at a furnace temperature of 650° C. Each cycle consisted of 24 hours in furnace and 1 hour out of furnace. The test pins were weighed to assess weight gain and optically examined to assess the coating condition. These tests were continued for accumulated times of several hundreds of hours. Like tests were also performed on further coated test pins using a more severe regime with a furnace temperature of 700° C. For each of these tests uncoated control specimens were also used for comparative purposes. Optical examination of the coated specimens revealed that, providing sufficient care was taken to ensure surface cleanliness at the coating stage, the adherance of the coating was excellent and there was no spallation damage or cracking at the cessation of the cyclic oxidation tests. No significant weight gain was detected.

The formation of alpha case in titanium alloys is manifest as a change in microstructure and this is detectable by suitable stain etching of a cross-sectioned specimen. The alpha case is also detectable by microhardness measurements for the alpha case has a hardness in the region of 700 on the Vickers diamond pyramid hardness scale compared with a base of around 400 for unaffected material.

Figure 2:
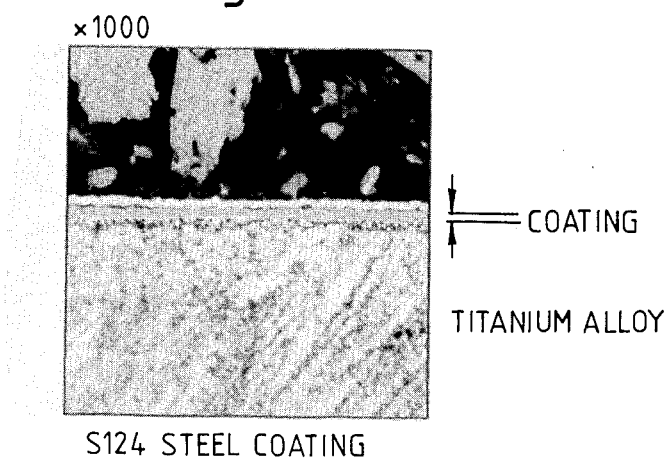
FIG. 2 is a microsection of a coated specimen which has been subjected to cyclic oxidation testing.
Figure 3:
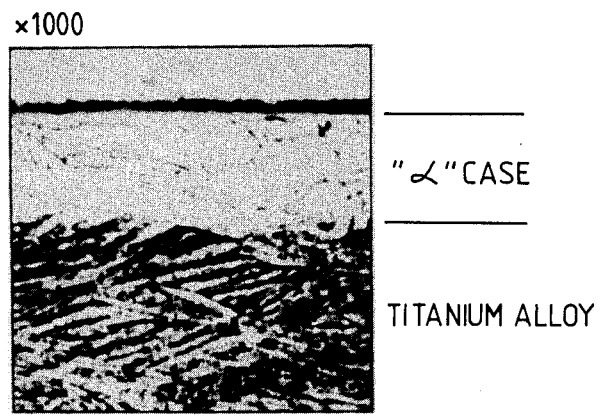
FIG. 3 is a microsection of an uncoated specimen which has been subjected to cyclic oxidation testing.

FIG. 2 shows a microsection at ×1000 magnification of a S124 coated specimen which has been subjected to 150 hours of cyclic oxidation testing using a furnace temperature of 650° C. It will be seen that this microsection reveals no significant change in microstructure in comparison with the pre test section shown in FIG. 1. FIG. 2 also confirms that the coating remains intact and fully adherent at completion of the test. FIG. 3, which is a microsection taken at the same ×1000 magnification of an uncoated specimen subjected to the same oxidation test, shows by comparison a significant degree of alpha case formation.

FIG. 4 compares microhardness measurements of coated and uncoated specimens after completion of 150 hours cyclic oxidation testing with a furnace temperature of 650° C. The uncoated specimen exhibits increased hardness consequent upon alpha case formation to a depth of at least 60 $\mu$m. For the coated specimens there is some increase of hardness relative to the inner region but the degree of change and the depth of penetration are much reduced.

Figure 5:
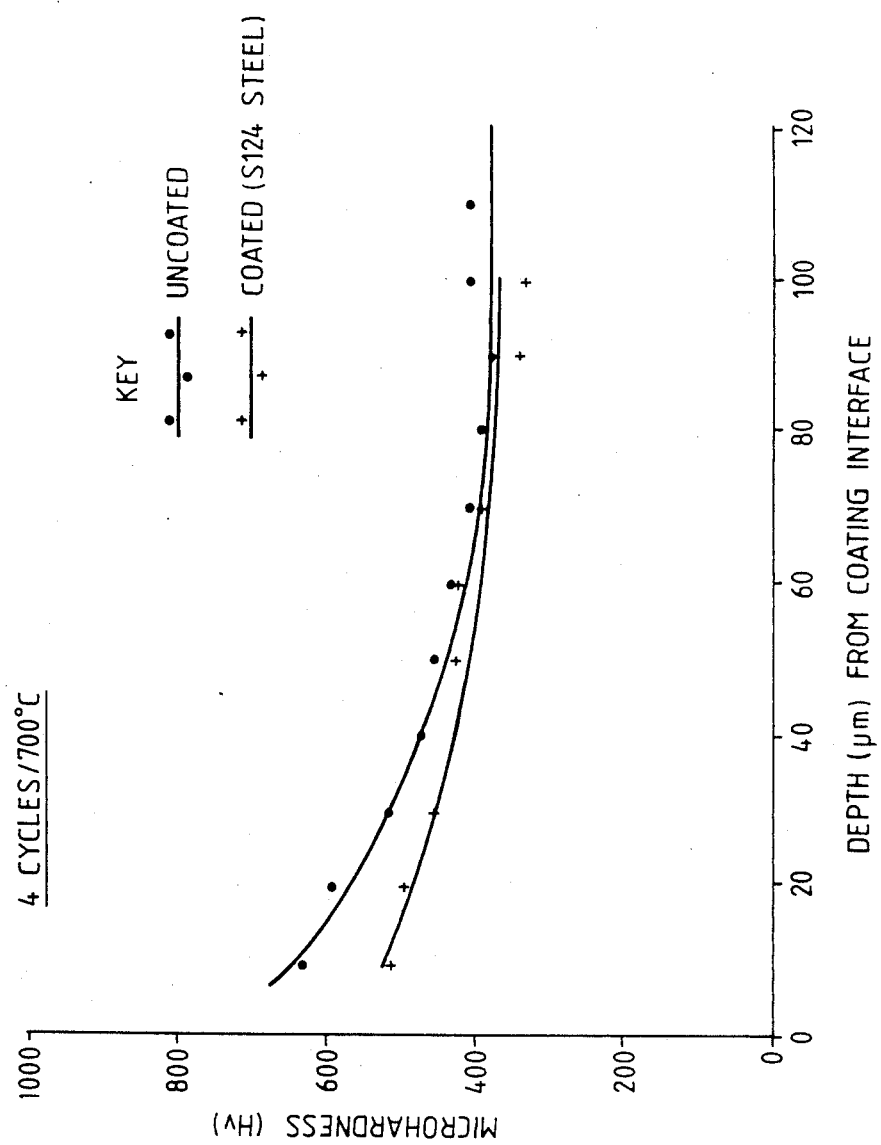

FIG. 5 makes a similar comparison after cyclic oxidation testing for 100 hours using a furnace temperature of 700° C. It will be seen that even at this more extreme temperature the increase of hardness and depth of penetration are still reduced for the S124 coated specimens to a worthwhile degree relative to the uncoated specimens through a deeper penetration of the hardened zone is noticeable. FIGS. 4 and 5 might seem to indicate that some alpha case formation takes place despite the protective coating. However no alpha case formation of significant extent is detectable by optical examination of microsections. Electron microprobe analysis of S124 coated specimens after long term oxidation testing has revealed some interdiffusion of elements between coating and substrate particularly an inward diffusion of iron. This is likely to produce a small change in the hardness of near-surface regions sufficient to produce the degree of change noticeable in FIGS. 4 and 5. However the degree of change is not likely to be such as to cause problems of embrittlement.

EXAMPLE 2

Cylindrical test pieces of IMI829 alloy were coated using the hot rod target sputtering process mention previously, to a depth of approximately 5 pm using targets consisting of a commercial alloy having the composition by weight of 15.5Cr-4.8 Al-0.3Y-0.3Si-0.03C-balance Fe. No significant variation from this was identified when the composition of the coating deposited was checked by electron microprobe analysis. Specimens thus coated have been subjected to cyclic oxidation testing of the type described previously, some at 650° C. furnace temperature others at 700° C. furnace temperature for some hundreds of hours. At completion of the tests there was no coating damage by separation, spallation or cracking evident by optical examination at sectioned specimens. Sectioned specimens were also subjected to microhardness measurement on a traverse through the surface layers. The microhardness traverse for a specimen subjected to 400 hours oxidation testing using a furnace temperature of 650° C. is plotted in FIG. 6. A similar plot for a 200 hour 700° C. specimen is shown in FIG. 7. FIG. 6 shows no appreciable hardening consequent on alpha case formation in the 650° C. test and FIG. 7 shows there is very little hardening from the 700° C. test. There is some scatter of individual points. This is not a reflection of poor measurement resolution rather the variation in microhardness experienced within the microstructure of normal titanium alloy.

EXAMPLE 3

IMI829 test pins have been coated using a different sputtering process using targets of the same commercial alloy used for Example 2. The process used was a sputter ion process of the type described by J E Restall and J P Coad at page 499 et seq. in Metals Technology 9, 1982. The test pins were subjected to an alternating positive/negative bias voltage during the deposition process for better control of coating distribution and microstructure. The composition of the coating was checked as for Example 2 by electron microprobe analysis and found to be substantially the same in composition as the target. The coating presented a more finely polished surface. Coating thickness varied with deposition process duration between 10 $\mu$m and 50 $\mu$m. 10 $\mu$m is the maximum permitted by current compressor design specification to avoid any loss of compressor surge margin. Consequently the more thickly coated specimens are unrepresentative of compressor components. The more thinly coated specimens were subjected to cyclic oxidation tests as given to the specimens in Examples 1 and 2. These tests were satisfactorily completed but longer term tests, yet to be completed will be necessary in order to give a feel for the relative merits of the coatings of Example 3 with regard to the others given the greater coating thickness.

We claim:

1. An article comprising a near -α titanium based alloy when coated with a high temperature oxidation and/or corrosion resistant coating, the coating being applied by a process selected from the group consisting of ion plating, sputter plating and sputter ion plating and comprising an iron-chromium based alloy wherein the iron and chromium in combination constitute at least 75% by weight of the applied coating with an iron to chromium ratio in the range 10:1 to 2.5:1.

2. An article as claimed in claim 1 in which the iron-chromium based coating additionally comprises 2-12% by weight aluminium.

3. An article as claimed in claim 1 in which the nickel-chromium based coating additionally comprises 2-12% by weight silicon.

4. An article as claimed in claim 1 in which the iron-chromium based alloy incorporates yttrium.

5. An article as claimed in claim 1 in which the iron-chromium based alloy incorporates boron.

6. An article as claimed in claim 1 in which the iron-chromium based alloy incorporates lanthanum or cerium.

7. An article as claimed in claim 1 in which the iron-chromium based alloy incorporates platinum or silver or rhodium.

* * * * *

UNITED STATES PATENT AND TRADEMARK OFFICE
CERTIFICATE OF CORRECTION

PATENT NO.  : 4,946,749

DATED       : August 7, 1990

INVENTOR(S) : Restall, deceased, et al

It is certified that error appears in the above-identified patent and that said Letters Patent is hereby corrected as shown below:

On the title page item [75] should read

-- James E. Restall, deceased, late of Camberley, England, by Janet E. Restall, Executrix, Camberley; Tony Homewood, Farnborough, all of England Item [19] should read --Restall, deceased, et al.

Signed and Sealed this

Twenty-third Day of March, 1993

Attest:

STEPHEN G. KUNIN

*Attesting Officer*         Acting Commissioner of Patents and Trademarks